(12) United States Patent
Du et al.

(10) Patent No.: US 7,120,220 B2
(45) Date of Patent: Oct. 10, 2006

(54) NON-VOLATILE COUNTER

(75) Inventors: Xiao-Hong Du, Colorado Springs, CO (US); Craig Taylor, Colorado Springs, CO (US)

(73) Assignee: Ramtron International Corporation, Colorado Springs, CO (US)

( * ) Notice: Subject to any disclaimer, the term of this patent is extended or adjusted under 35 U.S.C. 154(b) by 76 days.

(21) Appl. No.: 11/021,394

(22) Filed: Dec. 23, 2004

(65) Prior Publication Data

US 2006/0140331 A1 Jun. 29, 2006

(51) Int. Cl.
*G07C 8/00* (2006.01)
*G06M 3/00* (2006.01)

(52) U.S. Cl. .......................... 377/15; 377/16; 377/28; 377/33

(58) Field of Classification Search ............... None
See application file for complete search history.

(56) References Cited

U.S. PATENT DOCUMENTS

| | | | |
|---|---|---|---|
| 3,950,737 A | | 4/1976 | Uchida et al. |
| 4,439,764 A | * | 3/1984 | York et al. ............. 340/870.02 |
| 4,751,721 A | * | 6/1988 | Wissell .................. 377/20 |
| 4,947,410 A | * | 8/1990 | Lippmann et al. ............ 377/26 |
| 5,222,109 A | | 6/1993 | Pricer |
| 5,386,533 A | * | 1/1995 | Morris ................... 711/103 |
| 5,475,302 A | | 12/1995 | Mehnert et al. |
| 5,535,142 A | | 7/1996 | Mehnert et al. |
| 5,565,769 A | | 10/1996 | Mehnert et al. |
| 5,708,605 A | | 1/1998 | Okamoto et al. |
| 5,714,882 A | | 2/1998 | Mehnert et al. |
| 5,761,609 A | * | 6/1998 | Chen ..................... 455/26.1 |
| 6,084,400 A | | 7/2000 | Steinich et al. |
| 6,650,158 B1 | | 11/2003 | Eliason |
| 6,687,325 B1 | | 2/2004 | Wells |
| 6,693,839 B1 | | 2/2004 | Onozuka et al. |
| 6,721,385 B1 | | 4/2004 | Siess et al. |
| 6,735,269 B1 | | 5/2004 | Siess et al. |
| 6,973,688 B1 | * | 12/2005 | Barker et al. ............... 5/600 |

FOREIGN PATENT DOCUMENTS

JP 407162292 * 6/1995

OTHER PUBLICATIONS

Computer Engineering Hardward Design, by Morris Mano, 1988, pp. 120-121.*

* cited by examiner

*Primary Examiner*—Tuan T. Lam
(74) *Attorney, Agent, or Firm*—Hogan & Hartson L.L.P.

(57) ABSTRACT

A non-volatile counter circuit includes a state machine having a first input for receiving one or more control signals, a second input for receiving a current count value, a third input for receiving historical information, and an output for providing a next count value and an up/down control signal, and a non-volatile counter having an input coupled to the output of the state machine, and an output for providing a non-volatile count value. The non-volatile counter can be implemented onto a single integrated circuit using ferroelectric memory technology. The non-volatile counter circuit includes a first power supply node and a second power supply node for receiving power for operating the non-volatile-counter circuit through a first power supply or a second power supply, or both. The first and second power supplies can be low energy power supplies such as that provided by a sensor, or can be conventional power supplies. Either of the first and second power supplies can be internally boosted using an internal voltage doubler or other boosting circuitry.

19 Claims, 11 Drawing Sheets

NON-VOLATILE COUNTER

BACKGROUND OF THE INVENTION

The present invention relates, in general, to the field of counter circuits. More particularly, the present invention relates to an integrated counter circuit particularly well suited for use with a low-power sensor.

Counter circuits, and even non-volatile counter circuits are known by those skilled in the art. Existing non-volatile counter circuits use, for example, flash memory, battery-backed memory, EEPROM or other electrically programmable non-volatile memory, as well as other technologies. Problems faced with existing non-volatile counter circuits include, but are not limited to low maximum count value and short counter life, errors due to imprinting problems, as well as limited use in low-power sensor applications due to excessive power consumption especially while the count is being updated.

A non-volatile technology that is more suited to counter circuits, especially in applications where only low power levels are provided by a sensor, is ferroelectric technology. Ferroelectric cells consume little power during reading or writing data. For low density applications such as a counter, memory cells containing two transistors and two ferroelectric capacitors, ("2T/2C") can be used. Ferroelectric 2T/2C memory products are manufactured and sold by Ramtron International Corporation FRAM. A 2T/2C memory is also described in U.S. Pat. No. 4,873,664 entitled "Self Restoring Ferroelectric Memory", which is also hereby incorporated by reference.

What is desired is a non-volatile counter using ferroelectric technology that solves many of the problems associated with prior art non-volatile counter circuits, and is especially well adapted to use in low-power sensor applications.

SUMMARY OF THE INVENTION

According to an embodiment of the present invention, a non-volatile counter circuit includes a state machine having a first input for receiving one or more control signals, a second input for receiving a current count value, a third input for receiving historical information, and an output for providing a next count value and an up/down control signal, and a non-volatile counter having an input coupled to the output of the state machine, and an output for providing a non-volatile count value. The non-volatile counter can be implemented onto a single integrated circuit using ferroelectric memory technology. The non-volatile counter circuit includes a first power supply node and a second power supply node for receiving power for operating the non-volatile counter circuit through a first power supply or a second power supply, or both. The first and second power supplies can be low energy power supplies such as that provided by a sensor, or can be conventional power supplies. Either of the first and second power supplies can be internally boosted using an internal voltage doubler or other boosting circuitry.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A REPRESENTATIVE EMBODIMENT

Figure 1A:
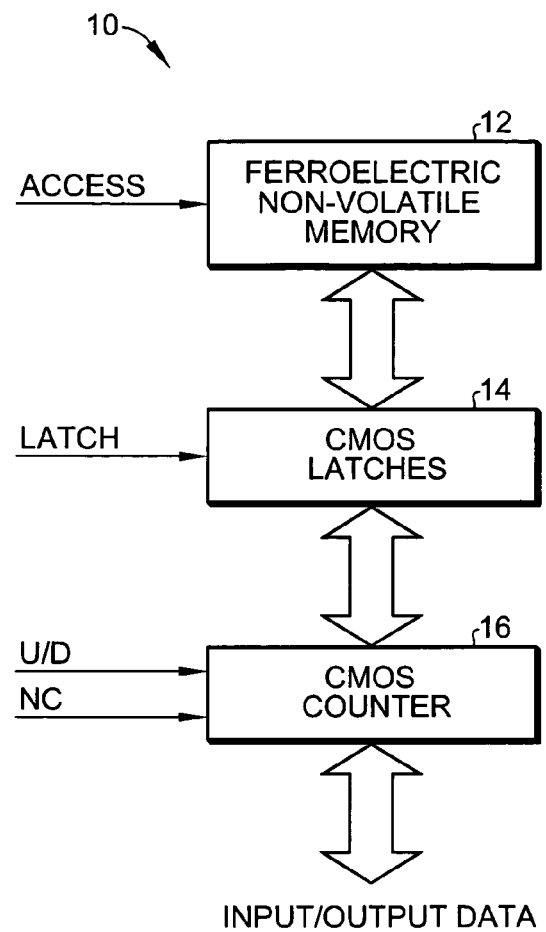
FIG. 1 is a block diagram of the core of the non-volatile counter according to an embodiment of the present invention.

Referring now to FIG. 1(a), the functional block diagram of the core 10 of the non-volatile counter according to an embodiment of the present invention is shown. Core 10 includes a ferroelectric non-volatile memory 12, CMOS latches 14, and a CMOS counter 16. The ferroelectric non-volatile memory 12 stores the previous count value, the CMOS latches 14 act as a data relay between the ferroelectric memory 12 and the CMOS counter 16, and the CMOS counter 16 performs the counting operations. Whenever a counting operation is required, the ACCESS signal goes high to start an access to the ferroelectric memory 12 and the previous count value is read out and latched to the CMOS latches 14. According to the control signals U/D and NC, the CMOS counter 16 performs counting up, counting down, or no counting. The resulting data are sent back to the ferroelectric memory 12 to update the count value through the CMOS latches 14.

Figure 2:
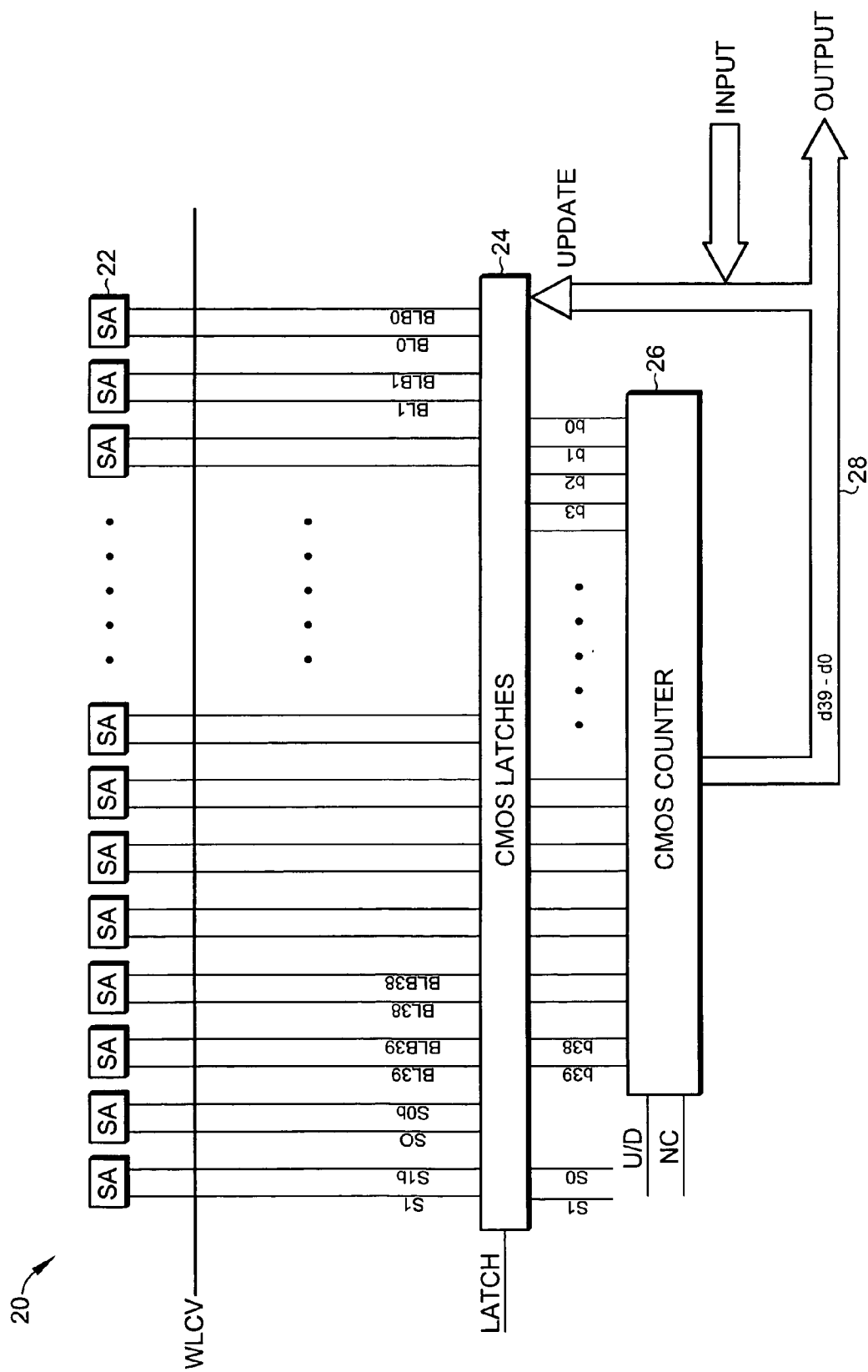
FIG. 2 is a schematic diagram of the implementation of the core of the non-volatile counter according to an embodiment of the present invention.

The implementation of the core 20 of a 40-bit counter is shown in FIG. 2. The upper portion of FIG. 2 is a standard 2T/2C memory with one row WLCV for storing the count value. After the data is read out from the memory, it is latched by the CMOS latches 24 when the control signal LATCH goes high. The count value is stored in BL39–BL0. In addition to the count value, there are extra columns for storing previous states which may be used to determine current counting operations. FIG. 2 shows two columns, S1–S0 (and complementary data columns S1b and S0b), but more columns can be used if desired. The latched data b39–b0 is fed to the CMOS counter 26. There are two control signals for the counter 26, U/D and NC. The counter 26 performs a counting operation only if NC is zero; otherwise, it just passes the data like a buffer. For example, NC is set to one when the user is reading or writing the count value. The NC signal must be reset to zero to do a counting operation. Whether counting up or counting down is performed is determined by the U/D signal. If U/D is one, the counter 26 counts up; otherwise, it counts down. What operation is selected is dependent on the desired application. For different applications, control signals U/D and NC are different functions of user input and the previous states S1–S0. These functions are implemented in a block called count control, which are described in further detail below. The CMOS lathes 24 are bi-directional. They can keep the values of b39–b0 and, at the same time, pass those same values of d39–d0 to the memory. The data after the counter, d39–d0, are fed to two paths: one is to the OUTPUT bus if the operation is read and the other is to the CMOS latches 24 to update the values in the memory through the UPDATE bus. The count value can be set by the user through the INPUT bus.

Figure 1B:
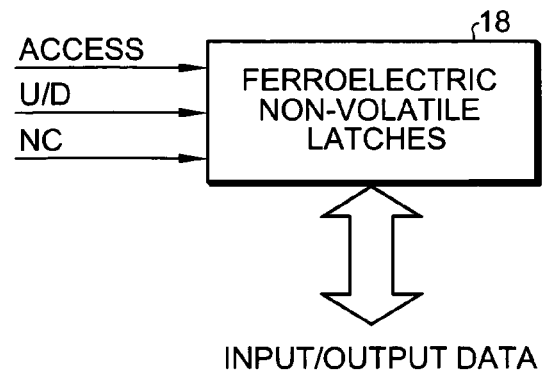

Another implementation of the core of the non-volatile counter according to the present invention is to use ferroelectric nonvolatile latches 18 as is shown in FIG. 1(b). The blocks of the ferroelectric memory, the CMOS latches, and the CMOS counter can be combined together by using ferroelectric nonvolatile latches 18.

Figure 3:
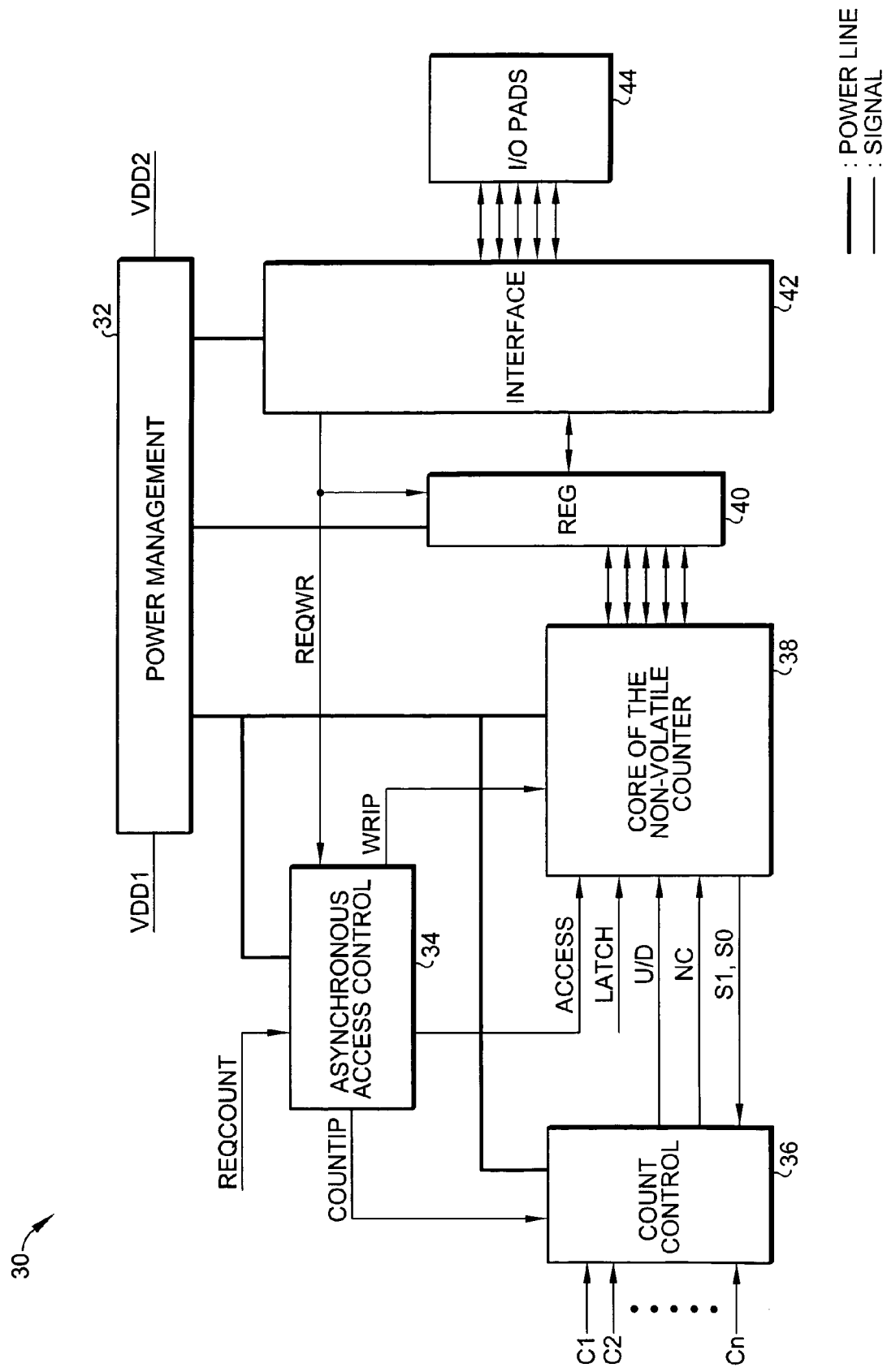
FIG. 3 is a block diagram of the core of the non-volatile counter showing peripheral logic blocks.

FIG. 3 shows a non-volatile counter 38 according to the present invention. The core of the non-volatile counter 38 is as shown in FIGS. 1 and 2. The structure is the same for all the applications, but the number of bits for the count value and the number of the previous states can be adjusted for different application requirements. The power management block 32 and the interface 42 are also dependent on applications and the user's requirements. The interface 42 can be a standard serial port such as I²C and SPI or a parallel port. One of the advantages that uniquely belong to the non-volatile counter 38 is that its power supply can be just a pulse. FIG. 3 shows two power supplies, VDD1 and VDD2. One of them can be pulses. Two examples of power management methods are described in further detail below. The REG block 40 contains bi-directional CMOS registers which provides the function of relaying data from the counter 38 to the interface 42 or vice versa.

A count request and a read/write request may occur at the same time. Therefore, an Asynchronous Access Control block 34 is added to enable just one access at a time and put the other access on hold until the end of the previous access. A simplified circuit for asynchronous access control is shown in FIG. 4 and is explained in further detail below.

During each counting operation, the previous count value is read from the ferroelectric memory and fed into the CMOS counter. After the counting operation, the new count value overwrites the previous value in the ferroelectric nonvolatile memory. Now still referring to FIG. 3, a counting operation is started with the REQCOUNT signal going high. The asynchronous access control circuit block 34 responds to the counting request and pulls the COUNTIP and ACCESS signals high to start reading the count value and the previous states from the ferroelectric memory. The count control block 36 sets the level of U/D and NC according to user input signals C1, C2, . . . Cn and the previous states S1 and S0. Then, the corresponding count operation is performed and the data will be updated as described above.

Figure 4:
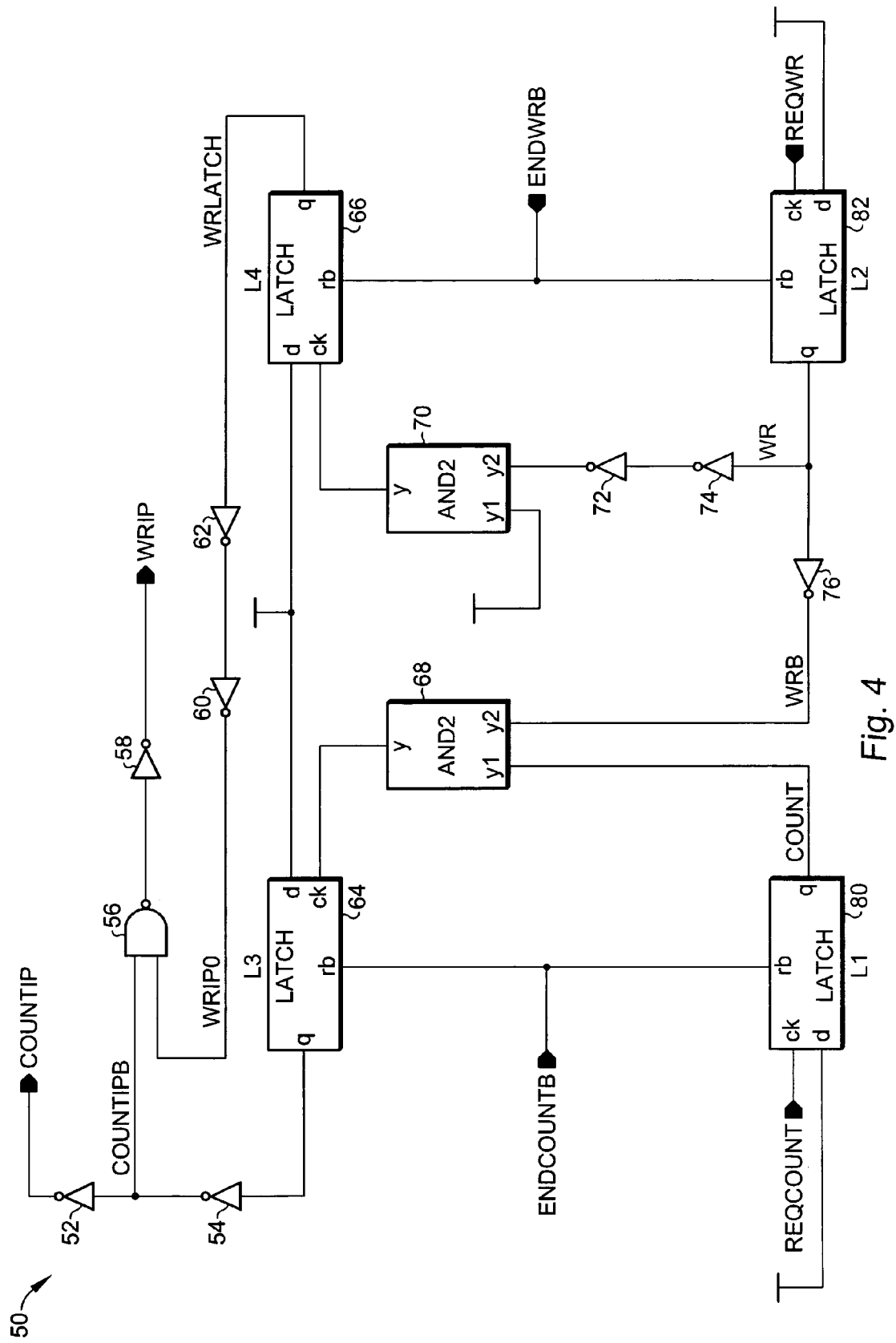
FIG. 4 is a simplified circuit for the asynchronous access control of the non-volatile counter.

FIG. 4 is the simplified circuit 50 for the asynchronous access control. There are four latches L1–L4, designated 80, 82, 64, and 66. When the input CK signal to a latch goes from low to high, the data at the input pin D is latched. The input pin RB is an active-low reset. When RB is low, the output state of the latch is reset to zero. During power up, both ENDCOUTB and ENDWRB are low and all the latches are reset to zero. As a result, COUNTIP and WRIP are zero. After the chip is powered up, ENDCOUNTB and ENDWRB become high to enable the asynchronous access control. The input pins REQCOUNT and REQWR are for count request and write/read request, respectively. If REQCOUNT becomes high before REQWR becomes high, then WB is one when COUNT becomes one. Thus, the input pin CK of L3 changes from zero to one and a one is latched by L3. As a result, COUNTIP changes from zero to one to start a counting operation and COUNTIPB changes from one to zero to keep WRIP at zero and block any write/read access. As long as COUNTIP is one and COUNTIPB is zero, WRIP is kept at zero and any write/read request is blocked. When the count operation is finished, a low pulse is applied on ENDCOUNTB to reset latches L1 and L3. After latches L1 and L3 are reset, COUNTIPB becomes one to release the path for the write/read request. On the contrary, if REQWR becomes high before REQCOUNT becomes high, WRB becomes zero before COUNT becomes one. Thus, the input pin CK of latch L3 is zero as long as WR is one and any count request is blocked. After some delay, the input pin CK of latch L4 becomes one and latches one to the output pin Q of latch L4. Then, WRIP becomes one to start a write/read access.

A count request and a W/R request may occur at the same time. In this case, there are two possibilities: either latch L3 successfully latches a one or not. If latch L3 latches a one, then COUNTIPB becomes one before WRIP0 becomes one since more delays are added on the right path for a W/R request. Then, a count operation is started and the W/R request is blocked until the end of the counting operation. On the other hand, if latch L3 is not able to latch a one, then the input pin CK of latch L3 remain zero since WRB is zero. So, the count request is blocked and a W/R operation is started. At the end of W/R operation, a low pulse is applied to ENDWRB to reset latches L2 and L4. After latches L2 and L4 are reset, WRB changes from zero to one to release the count request. Therefore, the deadlock case, (i.e. both count request and W/R request occur at the same time, but they block each other and no access is started), and the double access case, (i.e. both COUNTIP and WRIP become high at the same time), are excluded by adding more delay on the data path for the W/R request. In any case, only one access is started at a time by circuit 50 and the other access is put on hold until the previous access is done.

Figure 5:
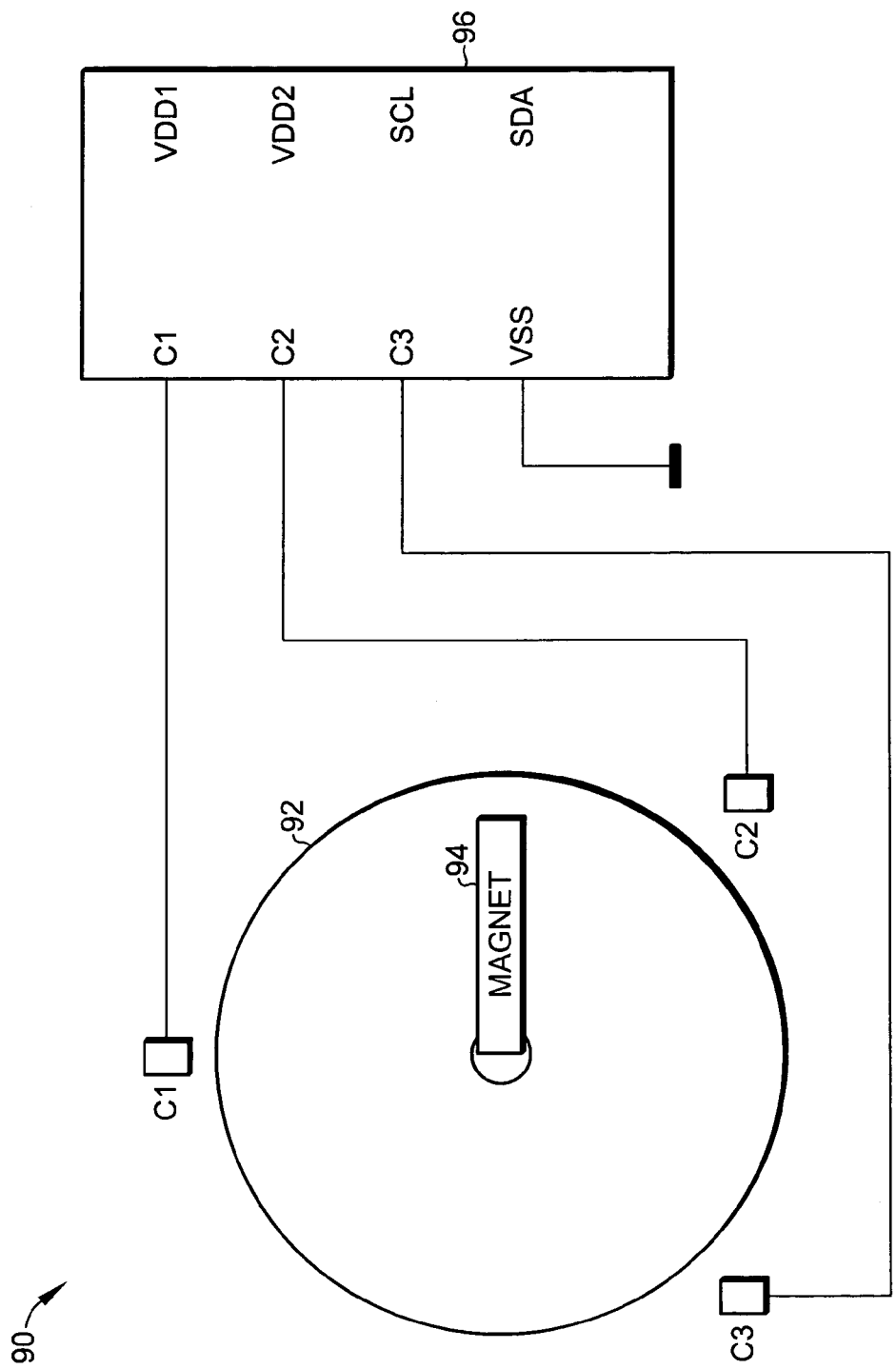
FIG. 5 is a block diagram of an application of the non-volatile counter of the present invention for providing a revolution count.

Referring now to FIG. 5, a typical application 90 is shown in which three magnetic sensors equally are distributed around a rotating shaft 92 including a magnet 94 such as in an automotive application are coupled to the C1, C2, and C3 counter inputs of non-volatile counter 96. There are two power supplies, VDD1 and VDD2. Either of VDD1 and VDD2 can be a standard power supply or a pulse from a sensor. SCL and SDA are two pins for a standard serial communication to non-volatile counter 96.

Figure 6:
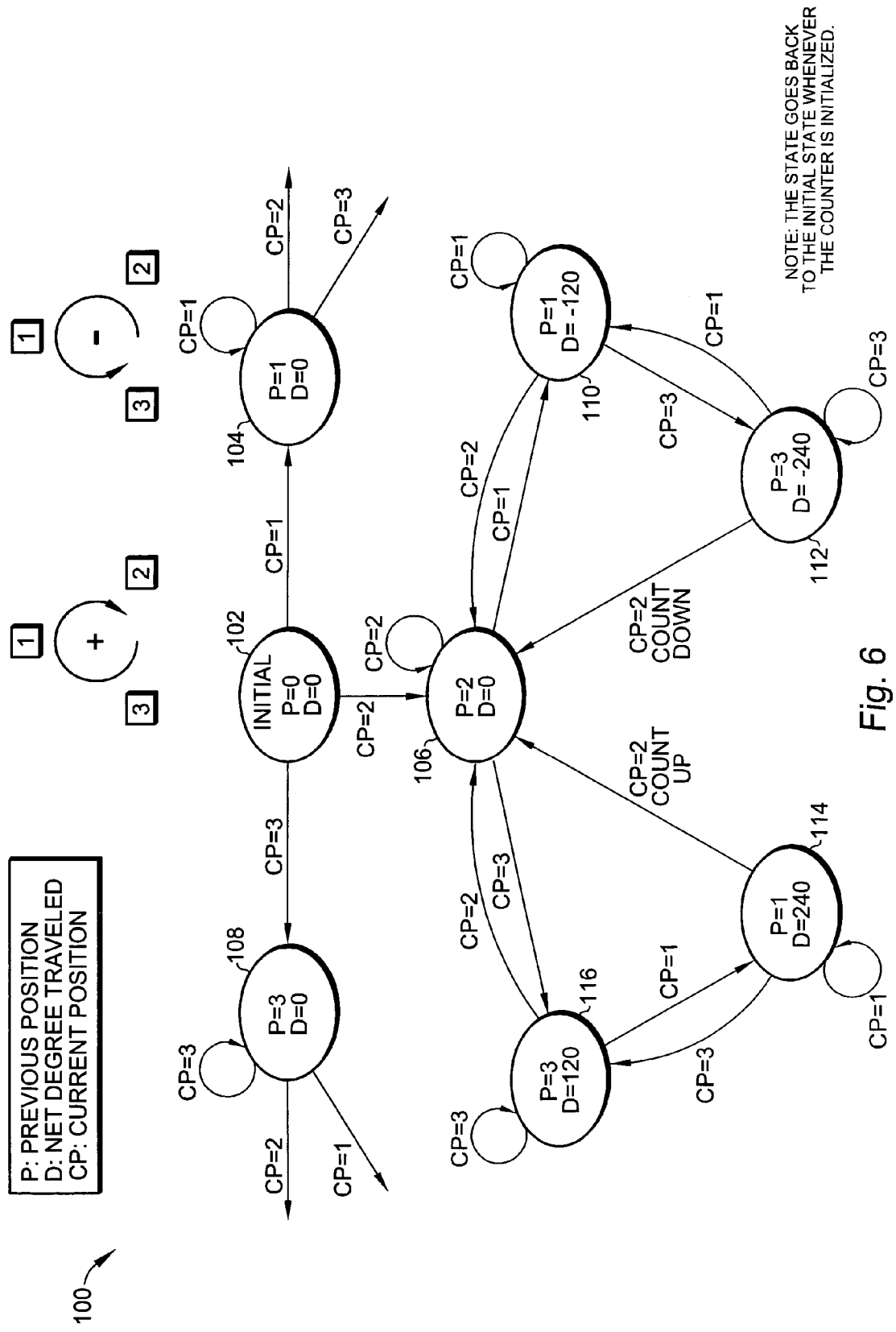
FIG. 6 is the state diagram for the revolution count application of FIG. 5.

The state machine diagram FIG. 6 is the counting sequence 100 for three sensors installed around a circle as shown in FIG. 5. When the magnet 94 rotates a full circle clockwise or anticlockwise, the counter counts up or down by one, respectively. Thus, the history of the magnet 94 and the current position is the required information to determine the corresponding counting operation. The history of the magnet 94 includes the previous position of the magnet and how many degrees it has traveled from a reference point. The reference point is not fixed, but rather is the first pulse position after the counter is reset. For example, if the magnet stays between positions 1 and 2 when the counter is reset and the magnet then passes position 2 clockwise after the reset, then the reference point for the counting sequence will be position 2 until the counter is reset again. In the diagram of FIG. 6, "P" is the previous position of the magnet. The initial value of P is zero before the first input pulse from any of C1, C2, or C3. In the diagram of FIG. 6, "D" records how many degrees the magnet has traveled from the first pulse position. D is positive for clockwise and negative for anticlockwise. Both P and D are initialized to zero whenever the counter is reset. P is encoded with two bits and D is encoded with three bits. Thus, the number of the previous states is five, i.e. S4–S0, instead of two as is shown in FIG. 2. In FIG. 6, "CP" is the current pulse position and indicates the origin of the pulse (C1, C2, or C3). FIG. 6 shows only the complete portion of the counting sequence for the first pulse coming from position 2. Since the three positions are logically identical, the counting sequences for the reference point being position 1 and 3 are very similar and are not shown in FIG. 6. As an example, assume the first pulse comes from position 2. When a pulse is received from position 2 at the initial state 102, position 2 is selected to be the new reference point. P is updated to 2 and D is still zero since the magnet is at the new reference point. The state changes from 102 to 106. At state 106, if the magnet swings around sensor 2 without passing either 1 or 3, the state will not change even though pulses may come from position 2. If the magnet passes position 1, then CP is 1 and the state goes to 110. P is updated to 1 and D is updated to –120 since the magnet traveled 120° anticlockwise from the reference point, position 2. If the magnet travels back to position 2, the state returns to 106. But if the magnet travels to position 3, P is updated to 3 and D is updated to –240. The state then goes to 112. If the magnet continually moves to position 2, the magnet travels –360° from the reference point and the counter counts down by one. At the same time, the state returns to 106. The counting sequences for other possible movements of the magnet are similar.

Figure 7:
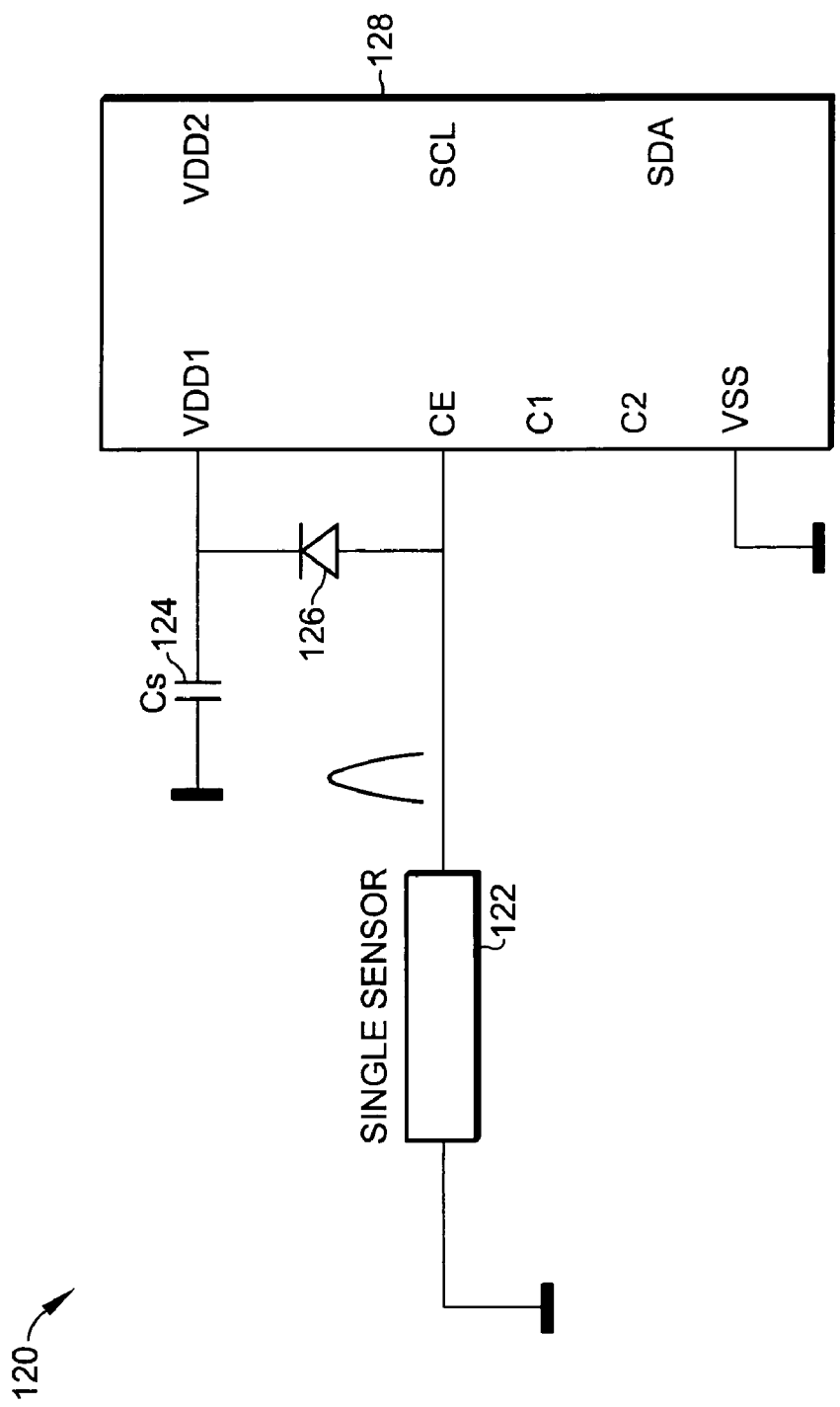
FIG. 7 is a block diagram of an application of the non-volatile counter of the present invention for counting up and counting down.

Referring now to FIG. 7, another application 120 using a single sensor input is shown. As mentioned above, the advantage of the non-volatile counter 128 according to an embodiment of the present invention is that the power supply can be a short voltage pulse. In FIG. 7, the output from a sensor 122 is also sent to VDD1, one of the supply pins, through a diode 126, as well as to the sensor input CE. Any power source can be used to power up VDD1. The power could be from a sensor 122 as shown in FIG. 7 or it could be another separate energy supply, such as a conventional power supply. A storage capacitor Cs, designated 124, is used to save the energy for counting, but capacitor 124 is not needed if the voltage pulse applied to VDD1 stays longer than the pulse applied on CE which triggers a counting operation. When a pulse is applied on CE, the signal REQCOUNT in FIG. 3 becomes high after some delay and the counter 128 performs one of three operations: counting up, counting down, or no counting, according to the logic relationships between U/D, NC, C1, C2, S1 and S0, which is defined by applications and implemented in the count control block 36 shown in FIG. 3.

Figure 8:
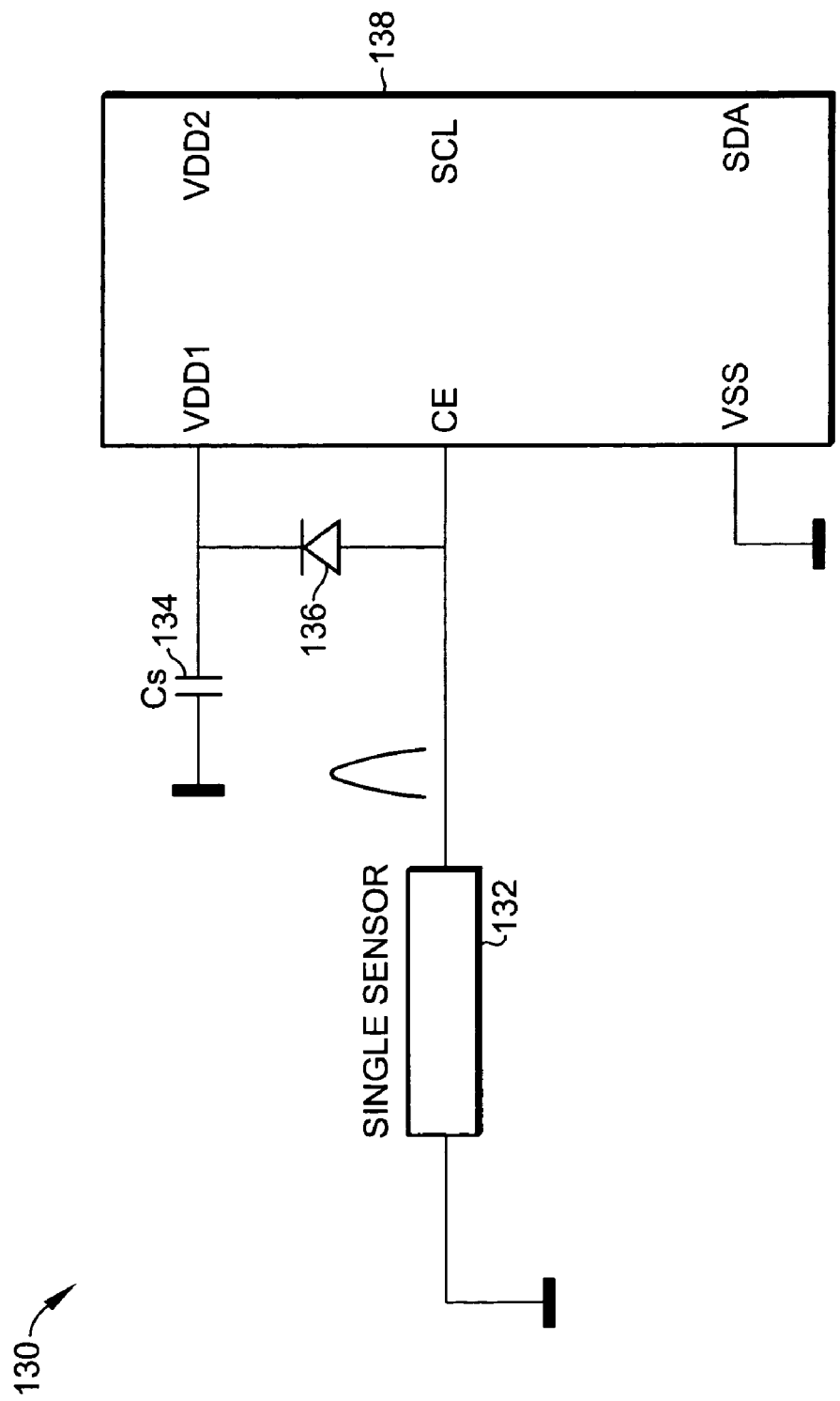
FIG. 8 is a block diagram of an application of the non-volatile counter of the present invention for counting up only.

Referring now to FIG. 8, another application 130 is shown using a single sensor input. When a pulse is applied on CE, the signal REQCOUNT in FIG. 3 becomes high after some delay and the counter 138 counts up by one. Thus, in FIG. 3, signal U/D is always set to one and NC is just the complement of COUNTIP.

Figure 9:
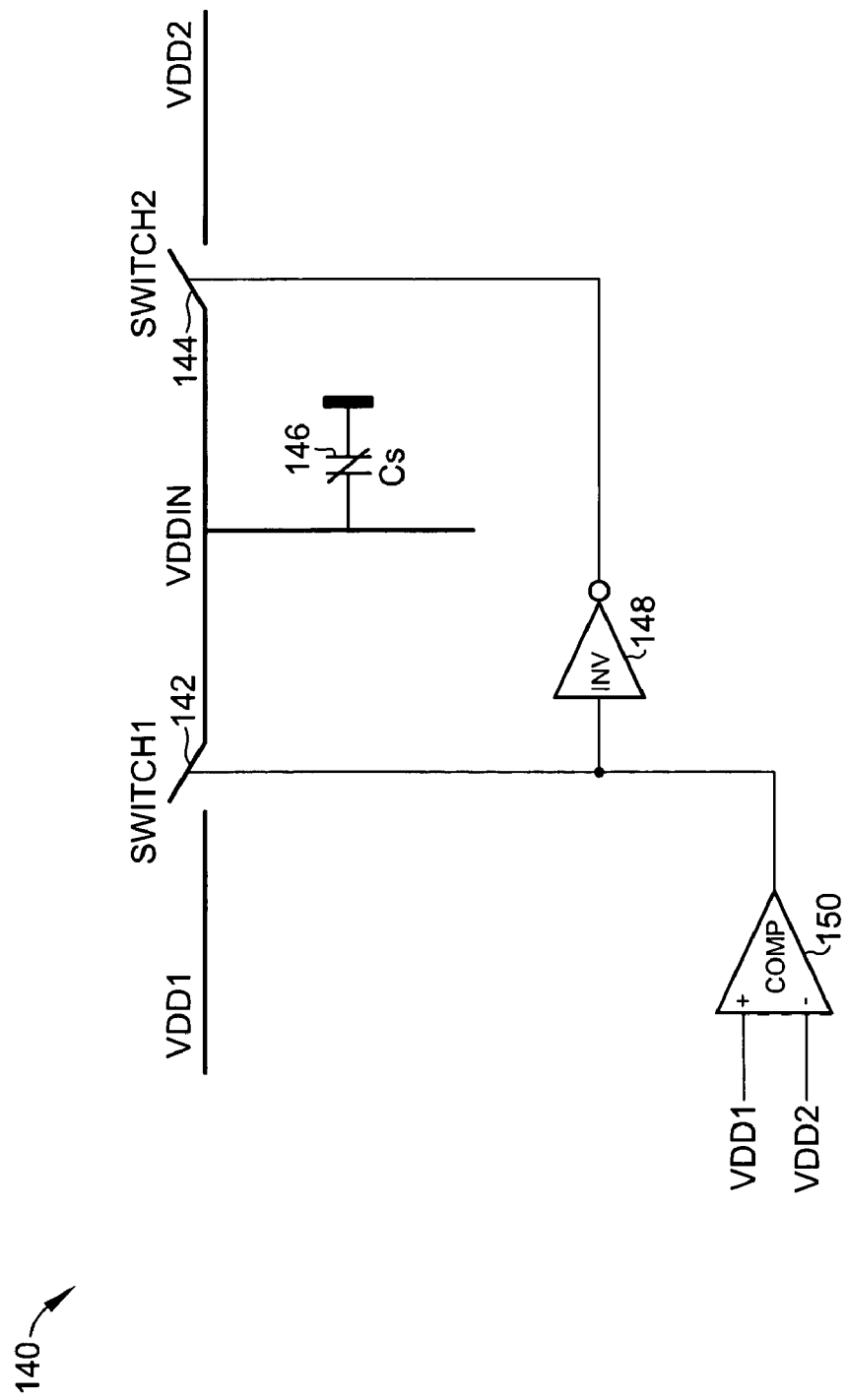
FIG. 9 is a simplified circuit diagram of a power switch for power management in the non-volatile counter of the present invention.
Figure 10:
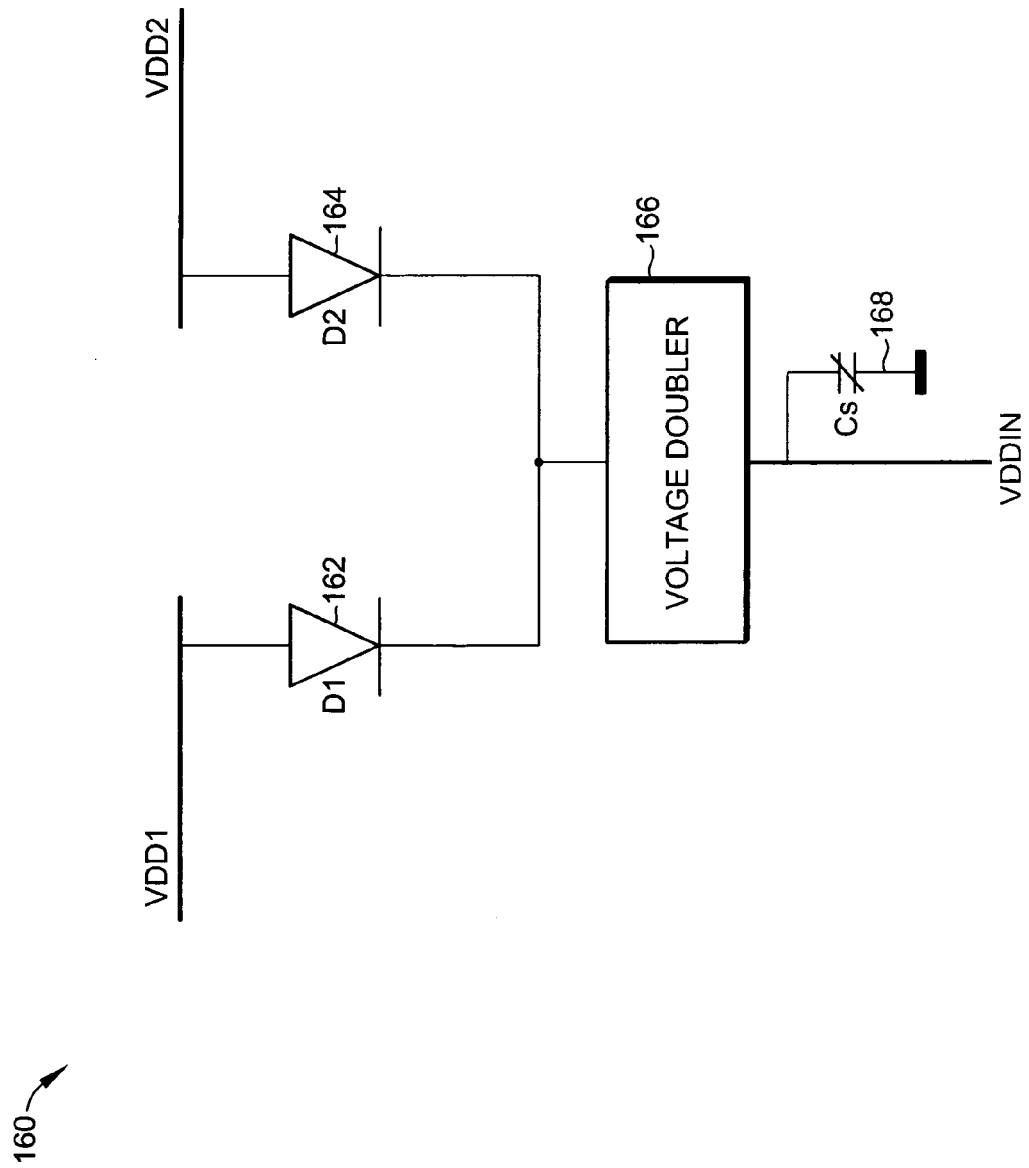
FIG. 10 is a simplified circuit diagram of a power "OR"-type circuit and a voltage doubler circuit for power management in the non-volatile counter of the present invention.

Two power management methods are shown in FIGS. 9 and 10. In FIG. 9, two power switches 142 and 144 are used to connect one of the power supplies, VDD1 and VDD2, to internal power bus VDDIN. A comparator COMP, designated 150, is used to select the higher level power supply. A ferroelectric capacitor Cs, designated 146, is used as an energy storage capacitor. An inverter 148 is used to provide the correct polarity switching signal to switch 144. In FIG. 10, two diodes, D1 and D2, respectively designated 162 and 164, are used to apply the higher of VDD1 and VDD2 to the voltage doubler block 166. Ferroelectric capacitor 168 is used as an energy storage capacitor. A voltage doubler 166 is used to double the internal voltage VDDIN.

Figure 11:
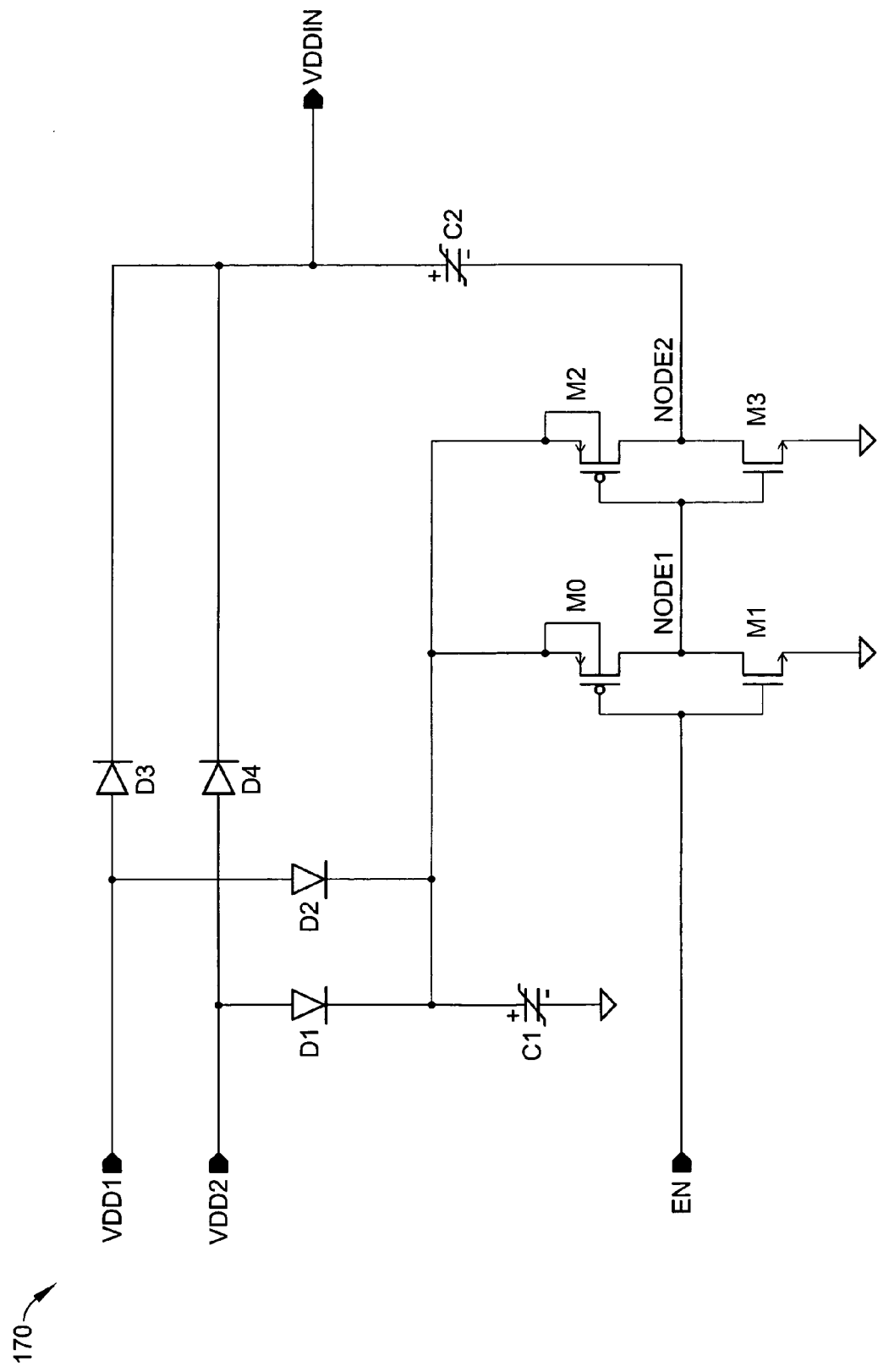
FIG. 11 is a simplified transistor-level circuit diagram for the voltage doubler of FIG. 10.

A voltage doubler circuit 170 is shown in FIG. 11. Diodes D1–D4 form a power "OR" type operation as described above. The higher voltage between VDD1 and VDD2 charges ferroelectric capacitors C1 and C2. During the charging period, the enable signal EN is kept at zero and thus NODE2 is also zero. After capacitors C1 and C2 are charged up, enable signal EN becomes high and NODE1 becomes low to drive NODE2 to the potential on the top electrode of capacitor C1. As a result, the internal voltage VDDIN is about two times that of the voltage on C1.

While there have been described above the principles of the present invention in conjunction with specific components, circuitry and bias techniques, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

We claim:

1. A non-volatile counter circuit comprising:
    a state machine having a first input for receiving one or more control signals, a second input for receiving a current count value, a third input for receiving historical information, and an output; and
    a non-volatile counter having an input coupled to the output of the state machine, and an output,
    wherein the state machine provides an up/down control signal to the non-volatile counter.

2. The non-volatile counter circuit of claim 1 in which the state machine comprises an output for providing a next count value.

3. The non-volatile counter circuit of claim 1 in which the non-volatile counter comprises an output for providing a count value.

4. The non-volatile counter circuit of claim 1 further comprising an energy-storing ferroelectric capacitor.

5. The non-volatile counter circuit of claim 1 in which the one or more control signals comprises a user input signal.

6. The non-volatile counter circuit of claim 1 in which the non-volatile counter comprises a ferroelectric non-volatile counter.

7. The non-volatile counter circuit of claim 1 in which the state machine and non-volatile counter are integrated onto a single integrated circuit.

8. A non-volatile counter circuit comprising:
a state machine having a first input for recieving one or more control signal, a second input for recieving a current count value a third input for recieving historic information, and an output,
a non-volatile counter having an input coupled to the output of the state machine, and an output; and a first power supply, second power supply and circuitry for selecting said first or second power supply for powering said non-volatile counter circuit.

9. The non-volatile counter circuit of claim 8 in which the first power supply comprises a low-power source of supply voltage.

10. The non-volatile counter circuit of claim 8 in which the second power supply comprises a conventional VCC source of supply voltage.

11. The non-volatile counter circuit of claim 8 further comprising means for independently boosting the voltages on the first and second power supply nodes.

12. A non-volatile counter integrated circuit comprising:
a first power supply node;
a second power supply node;
a non-volatile counter having a plurality of inputs for receiving control signals and count information; and
circuitry for selecting either the first power supply node or the second power supply node for powering the integrated circuit.

13. The integrated circuit of claim 12 further comprising a state machine coupled to the non-volatile counter.

14. The integrated circuit of claim 13 in which the state machine receives historical count information.

15. The integrated circuit of claim 12 in which the non-volatile counter comprises a ferroelectric non-volatile counter.

16. The integrated circuit of claim 12 in which the first power supply node is coupled to a low-voltage power source.

17. The integrated circuit of claim 12 in which the second power supply node is coupled to a conventional VCC power source.

18. The integrated circuit of claim 12 further comprising means for boosting the voltage present on the selected the first and second power supply nodes.

19. The integrated circuit of claim 12 further comprising means for independently boosting the voltage present on the selected the first and second power supply nodes.

* * * * *